United States Patent [19]

Fournier

[11] 4,404,077

[45] Sep. 13, 1983

[54] INTEGRATED SPUTTERING APPARATUS AND METHOD

[76] Inventor: Paul R. Fournier, 1027 San Andres #2, Santa Barbara, Calif. 93101

[21] Appl. No.: 355,853

[22] Filed: Mar. 8, 1982

Related U.S. Application Data

[63] Continuation-in-part of Ser. No. 251,871, Apr. 7, 1981, abandoned.

[51] Int. Cl.³ .............................................. C23C 15/00
[52] U.S. Cl. ................................. 204/192 R; 204/298
[58] Field of Search ............................ 204/192 R, 298

[56] References Cited

U.S. PATENT DOCUMENTS

| | | | |
|---|---|---|---|
| 3,325,394 | 6/1967 | Kay et al. | 204/298 |
| 4,155,825 | 5/1979 | Fournier | 204/192 R |
| 4,162,954 | 7/1979 | Morrison | 204/298 |
| 4,239,611 | 12/1980 | Morrison | 204/298 |
| 4,265,729 | 5/1981 | Morrison | 204/298 |

OTHER PUBLICATIONS

Waits, J. Vac. Sci. Technol., 15, (1978), pp. 179–187.

*Primary Examiner*—Arthur P. Demers
*Attorney, Agent, or Firm*—Daniel J. Meaney, Jr.

[57] ABSTRACT

An integrated sputtering means having a housing including a first cavity and a second cavity spaced a predetermined distance from the first cavity and wherein the housing includes a predetermined path extending between the cavities, a mount for supporting an ion target formed of at least one selected material in the interior of the housing wherein the ion target is positioned therein with a selected surface of the ion target positioned contiguous the predetermined path and between said cavities forming a lower boundary for the predetermined path and wherein the mount or the ion target includes means for containing electrons adjacent the ion target selected surface, an electron emitter positioned in one of the cavities, an electron collector positioned in the other of the cavities, and magnetic elements positioned along the predetermined path and located in a predetermined spaced relationship from the ion target selected surface for producing substantially linear shaped lines of magnetic flux between the magnetic elements which define a B field wherein the direction of the B field of the magnetic elements is oriented in a predetermined direction relative to the cavities and to the predetermined path adjacent the selected surface to produce a controlled magnetic field of flux having at least one selected flux density adjacent the selected surface wherein the selected surface of said ion target, said electron containing means and said substantially linear lines of flux define a plasma containment envelope which entraps and contains a plasma adjacent the selected surface to obtain controlled uniform target erosion is shown.

A method for utilizing the integrated sputtering means is also shown.

30 Claims, 16 Drawing Figures

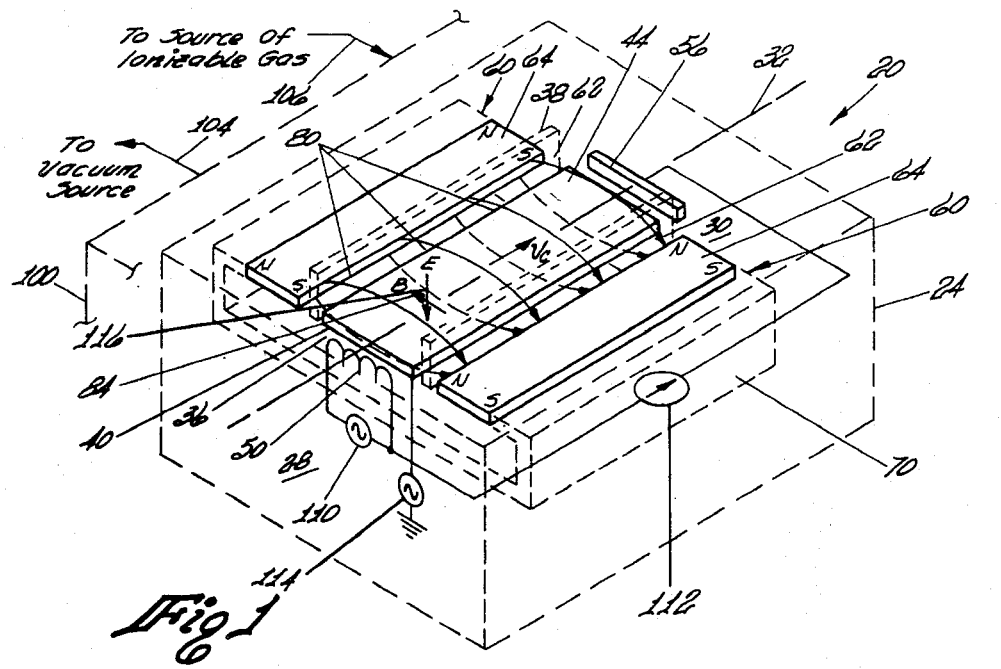
Fig 1
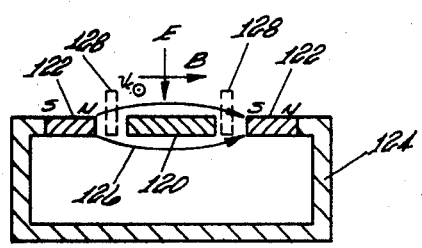
Fig 2
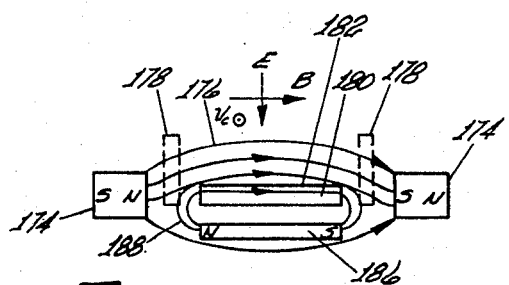
Fig 7
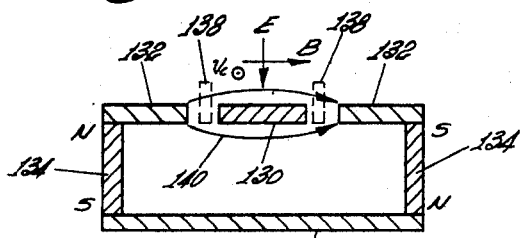
Fig 3
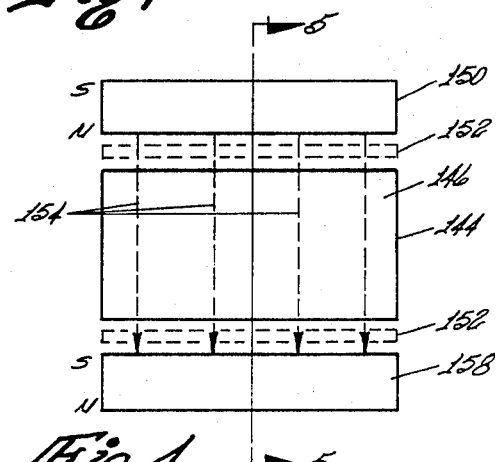
Fig 4
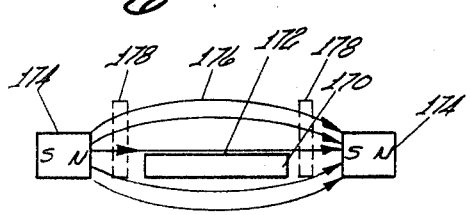
Fig 6 (NON-MAGNETIC)
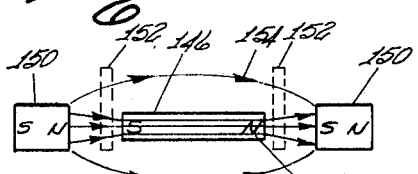
Fig 5 (MAGNETIC)

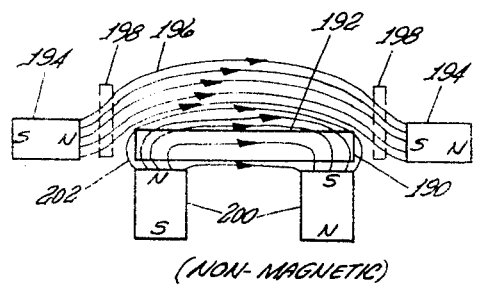
Fig 8 (NON-MAGNETIC)
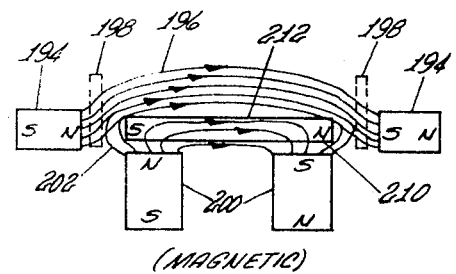
Fig 9 (MAGNETIC)
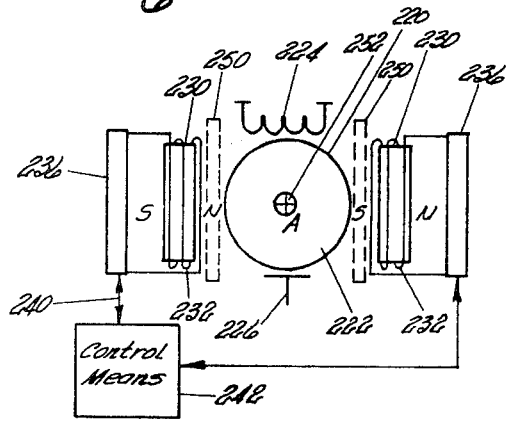
Fig 10
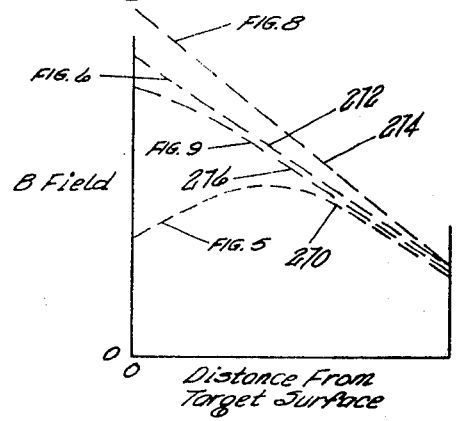
Fig 13
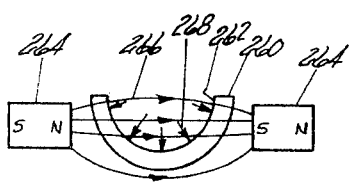
Fig 11
Fig 14
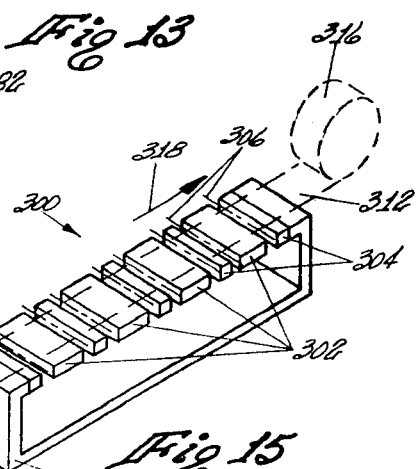
Fig 15
Fig 12
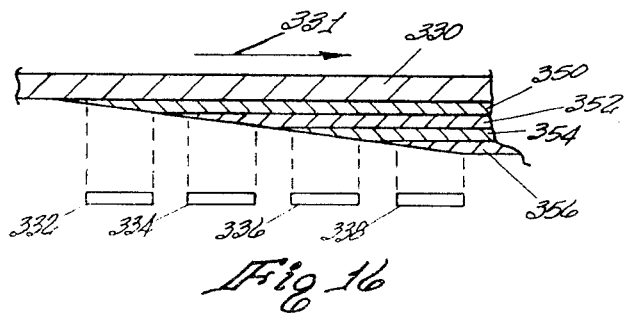
Fig 16

INTEGRATED SPUTTERING APPARATUS AND METHOD

This is a continuation-in-part, of application Ser. No. 06/251,871, filed Apr. 7, 1981, now abandoned.

BACKGROUND OF THE INVENTION

1. Field of the Invention

This invention relates to integrated sputtering apparatus for use in triode sputtering systems and more particularly to an integrated sputtering means having an ion target of at least one selected material and a controlled magnetic field having substantially linear lines of magnetic flux.

2. Description of the Prior Art

Triode sputtering apparatus, means and systems are well known in the prior art. An integrated sputtering apparatus and method are disclosed in U.S. Pat. No. 4,155,825 which was issued to the inventor of the present invention.

In U.S. Pat. No. 4,155,825, the integrated sputtering apparatus disclosed therein includes a magnetic means which is positioned adjacent the under surface of the ion target for establishing a controlled magnetic field of flux having shaped magnetic lines of force which traverse a predetermined path having at least a 90° or more bend and which establishes a magnetic flux pattern having at least one selected flux density and at least one field direction adjacent to the surface of the ion target. In the embodiment disclosed in U.S. Pat. No. 4,155,825, elongated permanent magnets were positioned on the under side of the target and were utilized for establishing the magnetic field. The strength of the magnetic field was well under 100 gauss with field strengths in the order of 40 gauss being preferred.

The use of a magnetic means for establishing a magnetic field having a strength in the order of less than 100 gauss was important in order to maintain an interrelationship between the magnetic field strength and the cathode potential. This enabled plasma entrapment to be maintained intimately with the upper surface of the ion target.

In known magnetron sputtering sources, a description of which is set forth in detail in U.S. Pat. No. 4,155,825, magnetic field strength in the order of about 100 gauss are utilized, but magnetic field strength more typically in the range of 250 gauss to 1000 gauss are required for efficient source operation.

In magnetron sputtering sources, an interrelationship exists between the magnetic field strength and the cathode potential. The relationship can be represented by the following equation (1) wherein:

$$\frac{|\bar{E}\,(\bar{B})|}{|\bar{B}|} \leq 1 \tag{1}$$

(a) $|\bar{E}\,(\bar{B})|$ is the absolute value of the electric field which is a function of the B field; and (b) $|\bar{B}|$ is the absolute value of the magnetic field in gauss As shown by the above equation (1), plasma entrapment in the magnetron source collapses if the cathode potential E (B) appearing on the cathode, for a fixed weak magnetic field, exceeds a critical value. Similarly, for fixed cathode voltage, if the magnetic field strengths are weakened below a critical level, plasma collapse occurs. Thus, in known magnetron sputtering sources, a balance between minimum magnetic field strength and maximum cathode potential must be maintained in order to achieve stable magnetron source operation.

In the integrated sputtering device disclosed in U.S. Pat. No. 4,155,825, weak magnetic fields with a high cathode potential are utilized. Thus, triode sputtering apparatus utilizing the teachings of U.S. Pat. No. 4,155,825 are free from the inherent relationship limitation between the E field and B field imposed on magnetron sources.

Although triode sputtering apparatus operate with considerably higher gas ionization efficiencies than magnetron sputtering sources, the target current densities which can be obtained from a magnetron source are typically substantially greater than the target current density of a triode sputtering source. There are a number of applications where it would be desirable to have a triode sputtering apparatus which would operate with the higher gas ionization efficiencies of the triode sputtering apparatus disclosed in U.S. Pat. No. 4,155,825, but with higher target current densities which are typical of magnetron sources.

SUMMARY OF THE INVENTION

The integrated sputtering means of the present invention results in a unique and improved integrated sputtering apparatus which operates as a triode sputtering apparatus with higher gas ionization efficiencies and which has operating target current densities which approach that of a magnetron source.

The integrated sputtering means of the present invention include means for defining a housing having a first cavity, a second cavity spaced a predetermined distance from the first cavity and means for defining a predetermined path extending between the first and second cavity. A means for mounting an ion target formed of at least one selected material in the interior of the housing is provided. The ion target is positioned in the interior of the housing defining means with a selected surface of the ion target positioned contiguous a predetermined path and between the cavities to form a lower boundary for the predetermined path. An electron emitter is positioned in one of the first cavity and the second cavity. An electron collector is positioned in the other of the first and second cavities. A magnetic means is positioned along the predetermined path and located in predetermined spaced relationship from the selected surface for producing substantially linear lines of magnetic flux which define a B field wherein the direction of the B field of the magnetic means is oriented in a predetermined direction relative to the first and second cavities and to the predetermined path adjacent the selected surface of the ion target to produce a controlled magnetic field of flux having at least one selected flux density adjacent the selected surface. The selected surface of the ion target, the electron containing means and the substantially linear lines of the flux define a plasma containment envelope which entraps and contains a plasma adjacent the selected surface to obtain controlled uniform target erosion.

In the known prior art triode sputtering apparatus, the current densities are lower than the current densities associated with the magnetron source. However, the triode sputtering apparatus operates with considerably higher gas ionization efficiencies and is utilizable in operating environments which do not require vacuums typically required for a magnetron sputtering source.

Also, target voltages in a triode sputtering apparatus can be varied independently of other operational parameters to provide a range and degree of control of the triode sputtering apparatus.

In the magnetron sputtering apparatus, the relationship set forth in equation (1) above, the E field, which is a function of the B field, and the B field itself are integrally related variables in the magnetron system. However, in a triode sputtering apparatus, the E field and B field can be controlled separately. This enables the triode sputtering apparatus to be free from the E/B relationship which is an inherent part of the magnetron sputtering system and which limits the application due to the inherent relationship between the E field and the B field.

In magnetron sputtering system, arcuate shaped lines of magnetic fields must be utilized to establish the B field. In the integrated sputtering apparatus set forth in U.S. Pat. No. 4,155,825, the magnetic means produces magnetic fields which emanate from a magnetic means located adjacent the underside or under surface of the ion target opposite to the selected surface. In function, the lines of magnetic flux from such magnetic means traverse a path wherein the lines of force must first traverse a path of at least 90° or more from under the ion target surface to the selected surfaces of the ion target. Secondly, the magnetic flux density of the lines of flux which traverse the selected surface of the ion target is approximately one-half of the lines of force available from the magnetic means. In substance, the path traversed by the line of force between the poles of the magnetic means can be characterized as substantially arcuate shaped lines of flux notwithstanding the fact that certain segments of the arcuate path may, within certain sections of path lengths, be linear.

In the present invention, the magnetic elements are sometimes in opposed, spaced alignment with one pole, such as a north pole, on one side of the ion target and the opposite pole, such as a south pole, positioned toward the other pole.

A significant advantage of the present invention is that the entire flux density emanating from a magnetic pole on one magnetic element traverses a substantially linear path to an opposed, aligned opposite magnetic pole resulting in substantially linear shaped lines of magnetic flux traversing a substantially linear path between two spaced magnetic poles. Thus, the entire flux density which traverses the selected surfaces of the ion target can be utilized to cooperate with the selected surface of the ion target and the electron containing means to form a containment envelope for the plasma. Variations in flux density have a direct and significant effect on the ion target erosion rate.

One advantage of the integrated sputtering apparatus of the present invention is that the E field can be controlled independently of the B field and the relationship therebetween can be independently controlled such that selected combinations of E field and B can be obtained as desired.

A still yet further advantage of the present invention is that if the ion target is formed of a magnetic material, the linear magnetic lines of flux developed from the magnetic elements have sufficient gauss density to offset the effect of the magnetic flux generated from the target in order to control target erosion.

A still yet further advantage of the present invention is that the same structure can be utilized for a non-magnetic target material and the strength of the magnetic fields at the target surface can be precisely controlled to control target erosion at a uniform rate.

A still yet further advantage of the present invention is that a precise target current density can be obtained from a triode sputtering apparatus as a function of field strength such that a controlled increase of field strength produces an increases in sputtering rate.

A still yet further advantage of the present invention is that the triode sputtering apparatus in combination with a variable flux density magnetic means and a use of an electron emitter and electron collector results in highly efficient plasma ionization with primary electrons from the electron emitter being confined to those proximity of the eroding target surface to increase the operating efficiencies thereof.

A still yet further advantage of the present invention is that the triode sputtering apparatus of the present invention utilizing linear magnetic fields is adapted for use in a housing wherein the sidewalls of the housing are permitted to reach a voltage potential which is a function of the parameters of operation of the system while concurrently having the linear lines of flux pass through the sidewalls of the housing and across the predetermined path of the ion target surface.

A still yet further advantage of the present invention is that the triode sputtering apparatus of the present invention permits the E field to be varied independently of the B field such that a wide range of relationships between the magnitude of the E field and the strength of the B field can be obtained and the total plasma containment can be obtained and high plasma ionization efficiencies obtained even though the relationship between the E field and the B field is in excess of one as defined by the equation (1).

DESCRIPTION OF THE PREFERRED EMBODIMENT

FIG. 1 is a perspective view of an integrated sputtering apparatus of the present invention;

FIG. 2 is a diagramatic view showing an ion target, spaced magnetic members adjacent the ion target, electron containing means, and a magnetic coupling means;

FIG. 3 is a diagramatic representation of an integrated sputtering means having an ion target, electron containing means, a magnetic pole piece adjacent the target, magnetic elements positioned contiguous the magnetic pole piece and a magnetic coupling piece which extends between the magnetic elements;

FIG. 4 is a top diagramatic view of an ion target; electron containing means and spaced magnetic means for producing substantially linear shaped lines of magnetic flux;

FIG. 5 is a diagramatic representation of a magnetic target, electron containing means and spaced magnetic elements;

FIG. 6 is a diagramatic representation of a triode integrated sputtering means having a non-magnetic ion target, electron containing means and spaced magnetic elements;

FIG. 7 is a diagramatic representation of a triode integrated sputtering means with a non-magnetic target, electron containing means, spaced magnetic elements adjacent the target and a single linear magnet element located under the target surface;

FIG. 8 is a diagramatic representation of a triode integrated sputtering means having a non-magnetic ion target, electron containing means and a quadrapole magnetic means comprising spaced magnetic elements and second and third magnetic members positioned under the non-magnetic ion target;

FIG. 9 is a diagramatic representation of a triode integrated sputtering means having the quadrapole magnetic means illustrated in FIG. 8 with a magnetic ion target.

FIG. 10 is a diagramatic reprensentation of a triode integrated sputtering means having a circular shaped ion target having an E field directed into the target, a source of copious supply of electrons, electron containing means, spaced magnetic elements, coil means for varying the magnitude of linear shaped lines of magnetic flux produced by the magnetic elements and control means for controlling the coil means;

FIG. 11 is a diagramatic representation of a triode sputtering means having an ion target having an arcuate shaped cross-section to define electron containing means and spaced magnetic elements;

FIG. 12 is a diagramatic representation of a triode sputtering means having an ion target having a channel shaped cross-section to define electron containing means and spaced magnetic elements;

FIG. 13 is a graph of the B field as a function of distance from target surface for the representations of FIGS. 5, 6, 8 and 9;

FIG. 14 is a graph showing the target current density, in milliamps per square centimeter, as a function of the B field strength, in gauss, for a triode sputtering means having spaced magnetic elements for producing substantially linear shaped lines of magnetic flux for precisely controlling the target erosion;

FIG. 15 is a diagramatic representation of a multistage triode integrated sputtering means using the teachings of this invention for sputtering layers of different selected ion target material on an article; and FIG. 16 is a diagramatic representation of a multistage apparatus having a plurality of triode integrated sputtering apparatus means as sputtering stations for depositing a plurality of stacked sputtered layers of different ion target materials on an elongated moving strip member.

DESCRIPTION OF THE PREFERRED EMBODIMENT

FIG. 1 shows the triode sputtering means generally by arrow 20. The integrated sputtering means comprises means defining a housing which is represented by dashed rectangle 24 which has a first cavity 28 and a second cavity 30 spaced a predetermined distance from the first cavity 28. The housing means 24 includes means for defining a predetermined path, shown generally by dashed line 32, which extends between the first cavity 28 and the second cavity 30.

The housing includes means shown generally as 36 for mounting, in the interior of the housing defining means 24, an ion target 40 formed of at least one selected material. The ion target 40 is positioned in the interior of the housing defining means 24 with a selected surface 44 positioned contiguous the predetermined path 32. The ion target 40 is positioned between cavities 28 and 30 and forms a lower boundary for the predetermined path 32.

In the preferred embodiment, an electron containing means is utilized adjacent the predetermined path 32 to define the side of a plasma containment envelope. In FIG. 1, the electron containing means may be the walls defined by the housing defining means 24 adjacent the edge of the ion target 40 and the location and positioning thereof is illustrated by dashed walls 38 in FIG. 1. In the alternative, the ion target 40 itself can be fabricated into a preformed shape to provide the equivalent of containment side for achieving plasma containment. This is considered in detail in connection with the discussion of FIGS. 11 and 12.

Thus, at least one of the housing means 36 and the ion target 40 includes means for containing electrons adjacent the ion target selected surface. In the embodiment of FIG. 1, the dashed lines 38 represent interior side walls of a housing. In operation, the housing is permitted to float electrically. As result thereof the housing side walls develop a space charge. The space charge interacts with the plasma to form a "plasma sheath" which effectly forms a thin barrier layer between the plasma and housing side walls defining sides of a containment envelope for the plasma.

Referring again to FIG. 1, an electron emitter 50 is positioned in one of the first cavity and the second cavity such as for example in cavity 28. An electron collector 56 is positioned in the other of the first or second cavity such as for example in cavity 30.

Magnetic means, shown generally positioned along the predetermined path 32, are located in a predetermined spaced relationship from the selected surface 44 of the ion target 40 as illustrated by spacing 62. In the embodiment illustrated in FIG. 1, the magnetic means 60 include elongated magnetic elements 64 which are in the form of elongated magnets having a length which is substantially greater than the width thereof. The magnetic elements 64 cooperate with a magnetic pole piece 70 which is located under the ion target 40 which couples the south pole of one magnetic element to the north pole of the other magnetic element. The pole piece 70 defines a closed magnetic path under the ion target 40. Thus, the flux lines of force emanating from the magnets 64 extend across the selected surface 44 and define the upper boundary of the predetermined path 32. The magnetic means 60 produce substantially linear shaped lines of force as shown by lines of force 80 which are essentially all of the lines of force produced by the magnets 64. The lines of flux extend directly from the south pole of one magnetic element, across the selected surface 44 of the ion target 40 to the north pole of the other magnetic element. The magnetic means 60 defines a B field wherein the direction of the B field, which is illustrated by arrow 84 in FIG. 1 and directed towards the south pole of magnet 64, is oriented in a predetermined direction relative to the first cavity 28 and the second cavity 30 and to the predetermined path 32 adjacent the selected surface 44 of the ion target 40. The magnetic means 60 produce a controlled magnetic field of flux having substantially linear shaped lines of force 84 which define a magnetic flux density having at least one selected flux density adjacent the selected surface 44.

When the triode integrated sputtering apparatus of FIG. 1 is utilized in a typical sputtering system, a copious supply of electrons is produced by the filament or electron emitter. The electrons collide with atoms of ionizable gas to produce a plasma. This mechanism is typical of triode sputtering apparatus.

One important characteristic of the integrated sputtering means of FIG. 1 is the high efficiency of sputtering which occurs due to electron confinement and to the plasma containment envelope which contains the plasma adjacent the selected surface 44 of the ion target 40. Thus, the selected surface 44 of the ion target 40, the electron containing means, for example side wall 38 or a preshaped ion target having the equivalent of the side walls 38, and the substantially linear lines of flux cooperate to define a plasma containment envelope which entraps and contains a plasma adjacent the selected surface to obtain controlled uniform target erosion.

In the preferred embodiment, the integrated sputtering means 20 can be utilized within an evacuated enclosure or in cooperation with a enclosure as part of an apparatus for depositing a thin film material on a substrate by triode sputtering of the ion target material.

The integrated sputtering means 20 can be adapted for use within or in cooperation with an enclosure illustrated by dashed box 100. In a typical triode sputtering system, a means for evacuating the enclosure, which is illustrated by arrow 104, establishes an initial vacuum which may be in the order of $10^{-4}$ torr or higher. In operation, the evacuated chamber is filled with an ionizable gas to a pressure level of about $10^{-3}$ torr.

Means for providing an ionizable gas to the enclosure 100, illustrated by arrow 106, communicates with a source of ionizable gas and transports the same into the interior of the evacuated enclosure 100. A typical ionizable gas for practicing this invention is argon.

In a typical apparatus, an energy source or filament supply, illustrated by source 110, is operatively coupled across the electron emitter 50. A plasma power supply 112 is operatively coupled between the electron emitter 50 and electron collector 56 and is utilized as a means for applying a voltage potential therebetween. The electron emitter 50 and the electron collector 56 produces a flow of primary electrons which flow from the electron emitter 50 to the electron collector 56 and which have sufficient energy to ionize the ionizable gas received from a source of ionizable gas applied to the enclosure 100 by inlet 106. The ionizable gas is ionized along the predetermined path 32 contiguous the selected surfaces 44 of the ion target 40 establishing plasma flow which extends along the predetermined path 32 and which is contained within the plasma containment envelope defined on the bottom by the selected surface 44, on the sides by the electron confining means, e.g., walls 38 and on the top by the substantially linear shaped lines of magnetic force 80.

A means 114 for applying a negative voltage potential on the ion target is provided to extract and accelerate positively charged ions into the selected surface 44 of the ion target 40.

The selected surface 44 forms the lower boundary for the plasma flow to sputter atoms of material from the selected surface 44 forming an atmosphere of sputtered ion target material. Atoms of ion target material are deposited on an article or substrate.

In FIG. 1, electromotive force, which define an E field, is shown by arrow 116 and the direction of the E field of the voltage establishing means 114 is perpendicular to the predetermined direction of the B field 84 and in a direction to cause the average velocity vector, shown as Vc, of the electrons emitted by the electron emitter 50 to be directed along the predetermined path 32, and adjacent the selected surface 44 of the ion target 40, to the electron collector 56. In the embodiment shown in FIG. 1, the direction of the E field is into the selected surface 44 of the ion target 40.

On a typical triode integrating sputtering system, the energy source 110 may be a filament supply having a 10 volt, 40 amp, 60 Hertz AC operating characteristic. The electron collector 56 is electrically connected to the electron emitter 60 through a plasma power supply 112 which may be a 100 volt, 18 amp DC power supply with the electron collector 56 being at a positive potential relative to the electron emitter 50. The ion target 40 may be connected to a target supply 114 which may be a $-1000$ volt, 3 amp DC source supply. However, the ion target voltages can be controllable between $-50$ volts to $-2000$ volts.

FIG. 2 which is a view from the electron collector 56 end, illustrates one type of construction for the magnetic means used in a triode integrated sputtering means having an ion target 120, elongated magnetic elements 122 and electron containing means 128. In the embodiment of FIG. 2, the magnetic element 122 are located in a spaced relationship with the ion target 120. The substantially linear lines of flux 126 pass through the electron containing means 128 which extend from a north pole marked "N" to a south pole marked "S", a magnetic pole piece 124 is coupled from the other pole of one magnetic element 122 to the other pole of the other magnetic element 122. The magnetic pole piece 124 insures that the lines of magnetic flux appear only across the magnetic gap formed between the poles of the magnetic elements 122 and across the selected surface of ion target 120. The B field and E field direction are shown by arrows marked "B" and "E", respectively. Vc is shown having a direction towards the electron collector 56 of FIG. 1.

FIG. 3 illustrates an alternative embodiment of construction of the magnetic means in a triode integrated sputtering apparatus having an ion target 130, elongated magnetic members 134 and electron collecting means 138. The magnetic members 134 are located adjacent the ion target 130 and magnetic pole pieces 132 extend from the magnetic elements 134 to conduct the lines of flux and direct the same across the ion target 130. A magnetic coupling pole piece 136 completes the magnetic circuit. Vc is shown having a direction towards the electron collector 56 of FIG. 1.

FIG. 4 illustrates an ion target formed of magnetic material 144 in a triode integrated sputtering apparatus with a planar selected surface 146, electron containing means 152, and elongated magnets 150 having an axial length which is approximately equal to the axial length of the ion target 144 and being positioned in a predetermined spaced relationship from the ion target 144 as illustrated in FIG. 4, a portion of the substantially linear shaped lines of force 154 traverse the selected surface 146.

In the sectional view of FIG. 5, which includes the same elements identified in FIG. 4, a portion of the substantially linear shaped lines of force are diverted by the magnetic ion target material 144. Specifically, in operation the magnetic ion target material 144 forms magnetic poles as illustrated by the "S" and "N" at edges thereof which are opposite to the magnetic poles established by magnets 150. Thus, the field strength of the magnetic elements in a triode integrated sputtering means when used in combination with a magnetic ion target material must be sufficient to define the top position of the plasma containment envelope since a portion of the flux is diverted by a magnetic ion target.

FIG. 6 illustrates an embodiment of the apparatus of FIG. 4 having a non-magnetic ion target 172, electron containing means 178, and magnets 174 which produce substantially linear shaped lines of force, a majority of which traverse the selected surface 172 of ion target 170. The magnets 174 could be raised or moved upward relative to the ion target 170 to have a greater number of the lines of flux traverse selected surface 172.

FIG. 7 illustrates a triode integrated sputtering means having the same elements as FIG. 6 shown as in target 180 having lines of flux emanating therefrom which define substantially linear shaped lines of force which traverse the selected surface 182. In addition to the magnets 174, which form the magnetic means, the embodimdent of FIG. 7 includes a supplemental magnetic means such as magnet 186, located on the underside of the ion target 180 and positioned with the poles thereof between the magnetic means 174 to form a substantially uniform B field across the selected surface 182 of the ion target 180.

FIGS. 8 and 9 illustrate another embodiment of a triode integrated sputtering means having a magnetic means which is formed of magnets 194 and which include a second and third magnetic means, such as magnets 200, positioned in a spaced relationship to the magnetic means 194 and having pole tips located on the underside of the ion target which is a non-magnetic ion target 190 in FIG. 8 and a magnetic ion target 210 in FIG. 9. The magnets 200 have a magnetic orientation which cooperate with the lines of flux of the magnetic means 194 to direct lines of flux between the pole tips of magnets 200 and the magnetic means 194 to form a substantially uniform B field across the selected surface of ion target which is selected surface 192 of FIG. 8 and selected surface 212 of FIG. 9.

The above type of construction of the magnetic means with the second and third magnetic means is generally referred to as the quadrapole magnetic means.

In FIG. 8, the substantially linear shaped lines of flux 196 traverse the selected surface 192 of ion target 190 and the lines of flux 202 emanating from the magnets 200 are additive with lines of flux 196 since the non-magnetic ion target 190 does not divert any of the lines of flux therethrough.

In FIG. 9, the substantially linear shaped lines of flux 196 likewise traverse the selected surface 212 of the magnetic ion target 210. In the absence of the magnets 200, the lines of flux 196 would be diverted by the magnetic ion target 210 in a similar manner as illustrated in FIG. 5. However, with quadrapole type of construction, magnets 200 produce lines of force which, in effect, offset the losses of the substantially linear shaped lines of force 196 which insures that the flux density thereof remains at a higher level to effect plasma containment.

FIG. 10 illustrates an embodiment of a triode integrated sputtering means wherein the magnitude of the B field can be controlled. The ion target 220 is circular in shape and has a planar selected surface 222 positioned adjacent an electron emitter 224 and electron collector 226. Electron confining means are shown by dashed rectangles 250. The magnetic means includes a coil means 232 operatively coupled to spaced ferromagnetic elements 230 located along the predetermined path with the ion target 220 therebetween. The coil means 232 is responsive to a controlled current via current source 236 which forms part of the coil means 232, which is applied thereto to establish between ferromagnetic elements 230 magnetic lines of force. The coil means varies the magnetic characteristics of the ferromagnetic elements 230 which results in the line of force varying across the selected surface 222 of the ion target 220. The coil means 232 is responsive to a control signal to vary the magnetic lines of force emanating from the magnetic means across the selected surface 222 of an ion target 220 resulting in control of the magnitude of the B field thereacross.

A control means 242 is operatively coupled to the coil means 232 through current source 236 for applying a control signal thereto to control the magnitude of the B field on the selected surface 222 of said ion target 220. The direction of the E field into the ion target 220 is shown by legend 252.

FIG. 11 shows a preformed ion target 260 with selected surface 262 which has an arcuate shape to enable the ion target itself to function as the electron containing means to define sides of the plasma containment envelope. Substantially linear shaped lines of flux 266 emanate from the magnetic means 264 which establishes the B field. The resulting E field, which is shown by arrows 268 and which is substantially normal to the selected surface 262, always crosses the B field which is a condition required for electron containment.

FIG. 12 illustrates the same structure with a "channel shaped" ion target 270 with a selected surface 272. The ion target 270 has side members 276. The E field, represented by arrows 268, do not cross the B field at the side wall 276, but the electrons and plasma are physically contained. It is possible that a portion of the side wall 276 would be controllably eroded.

FIG. 13 is a graph showing a plot of the B field in gauss as a function of distance from the selected surface of an ion target for FIG. 5 depicted by line 270; FIG. 6 depicted by line 272; FIG. 8 depicted by line 274 and FIG. 9 depicted by line 276.

Line 270 shows that a magnetic ion target substantially reduces the available B field while line 272 shows that a non-magnetic ion target does not reduce the B field. With the quadrapole magnetic means utilized in FIGS. 8 and 9, lines 274 and 276 show that the B field is only slightly reduced by a magnetic ion target.

FIG. 14 is a plot of B field, in gauss, as a function of target current density in milliamperes per square centimeter. Since complete plasma confinement is obtained by the substantially linear shaped lines of force, the erosion rate of the ion target can be precisely controlled. This results in a triode integrated sputtering means which has current densities several orders of magnitude greater than known devices. In addition, uniform and controlled ion target erosion can be precisely obtained.

FIG. 15 depicts a multi-stage, integrated sputtering apparatus 300 which include means 308, defining a support having a plurality of sputtering stages having ion target 302 and electron containing means 306 therein and which includes means for defining a plurality of independent spaced parallel predetermined paths one of which extends through use of each of the sputtering stages. The apparatus includes a plurality of means for mounting the ion targets 302 in each of the sputtering stages and along the predetermined paths associated with said sputtering stages. Each of the ion targets being 302 are formed of at least one selected material and positioned such that a selected surface of the ion target is contiguous its associated predetermined path which extends across its associated said sputtering stage such that each selected surface of each ion target forms a lower boundary for its associated predetermined path. In construction, at least one of the mounting means and its associated ion target of each of the plurality of mounting means and ion targets 302 includes means for containing electrons, shown by dashed line 306 adjacent its associated ion target selected surface. The apparatus includes means for emitting and collecting electrons positioned in each of said sputtering stages as described hereinbefore.

Magnetic means 304 are positioned along each of said predetermined paths and located in a predetermined spaced relationship from each of the selected surfaces of each of the ion targets 302 and produce a plurality of separate controlled magnetic fields of flux having substantially linear shaped lines of force occurring across each of said predetermined paths which define a magnetic flux pattern having at least one selected flux density adjacent each selected surface of each ion target. In this embodiment, the support means 308 also functions as a pole piece for the magnetron sources. The plasma containment envelopes are formed as described hereinbefore.

The multi-stage apparatus 300 has utility for coating articles such as, for example, substrates, disc shaped materials and elongated strip materials. FIG. 15 illustrates strip material 312 which is removed from roll 314, transported along path 318 past the multiple sputtering stages where the surface facing the apparatus 300 has layers of different sputtering material coated thereon and the coated material is wound on reel 316.

FIG. 16 illustrates diagramatically a member 330 being moved in the direction shown by arrow 331 past four sputtering stages 332, 334, 336 and 338 which coats thereon layers of material 350, 352, 354, and 356, respectively.

The integrated sputtering apparatus shown hereon can be used in a process or method for controlling the rate at which an ion target material can be sputtered from a selected surface of an ion target in triode sputtering apparatus wherein a plasma is formed in the vicinity of the selected surface of the ion target by electrons being transported along a predetermined path contiguous the selected surface from a cathode to an anode, which electrons collide with and ionize an ionizable gas thereby producing charged ions which sputter atoms of material from the ion target, comprising the steps of establishing with a magnetic means positioned along the predetermined path in a predetermined spaced relationship from the selected surface of the ion target substantially linear shaped lines of magnetic flux which define a B field wherein the direction of the B field of the magnetic means is oriented in a predetermined direction relative to the predetermined path and adjacent the selected surface; containing the electrons adjacent to the selected surface of said ion target with an electron containing means; and establishing with a voltage means between said ion target and a ground an electromotive force which defines an E field wherein the direction of the E field of the voltage is perpendicular to the predetermined direction of the B field and in a direction to urge the stream of electrons which flow from an electron emitter to an electron collector along said predetermined path and adjacent said selected surface of the ion target. Additional method steps can be added to the above.

Also, method for forming a thin film layer of material on an article within a sputtering zone is disclosed comprising the steps of mounting an ion target formed of at least one selected material within the sputtering zone and positioned a predetermined distance from a said article with the selected surface of an ion target forming a lower boundary for a predetermined path which extends across the selected surface of the ion target; forming along said predetermined path and between a said article and selected surface of the ion target a stream of electrons which flow from an electron emitter to an electron collector and containing electrons adjacent the ion target selected surface with an electron containing means; positioning along the predetermined path in a predetermined spaced relationship from the selected surface of the ion target a magnetic means for producing substantially linear shaped lines of magnetic flux which define a B field wherein the direction of the B field of the magnetic means is oriented in a predetermined direction relative to the predetermined path and adjacent the selected surface; and applying a voltage between said ion target and a ground for producing an electromotive force which defines an E field wherein the direction of the E field of the voltage is perpendicular to the predetermined direction of the B field and in a direction to urge the stream of electrons which flow from an electron emitter to an electron collector to be directed along said predetermined path and adjacent said selected surface of the ion target wherein said selected surface of said ion target, said electron containing means and said substantially linear lines of flux define a plasma containment envelope which entraps and contains a plasma adjacent said selected surface to obtain controlled uniform target erosion.

The integrated sputtering apparatus of the present invention has wide utility. Sputtering systems using the apparatus and method dissolved herein can be used in research and development activities or in production environment for producing electronic components, coating articles, substrates and thin film transducers, coating magnetic tapes and discs and for depositing thin film layers on substrates. The ion target material may be a selected material or an alloy and the sputtering rate thereof can be precisely controlled with a predictable characteristic curve of operation.

What is claimed is:

1. An integrated sputtering means comprising
means defining a housing having a first cavity and a second cavity spaced a predetermined distance from said first cavity and means for defining a predetermined path which extends between said first cavity and said second cavity;
means for mounting in the interior of the housing defining means an ion target formed of at least one selected material, said ion target being positioned in said interior of the housing defining means with a selected surface of said ion target positioned contiguous said predetermined path and between said cavities thereby forming a lower boundary for said predetermined path, at least one of said mounting means and said ion target including means for containing electrons adjacent the ion target selected surface;
an electron emitter positioned in one of said first cavity and said second cavity;
an electron collector positioned in the other of said first and said second cavity; and
magnetic means positioned along said predetermined path and located in a predetermined spaced relationship from said selected surface for producing lines of magnetic flux which define a B field wherein the direction of the B field of the magnetic means is oriented in a predetermined direction relative to said first and second cavities and to said predetermined path adjacent said selected surface to produce a controlled magnetic field of flux having substantially linear shaped lines of force which define a magnetic flux pattern having at least one selected flux density adjacent said selected surface, said selected surface of said ion target, said electron containing means and said substantially linear lines of flux define a plasma containment envelope which entraps and contains a plasma adjacent said selected surface to obtain controlled uniform target erosion.

2. The integrated sputtering means of claim 1 further comprising means for establishing a voltage between said ion target and ground for producing an electromotive force which defines an E field wherein the direction of the E field of the voltage establishing means is perpendicular to the predetermined direction of the B field and in a direction to cause the average velocity vector of the electrons emitted by said electron emitter to be directed along said predetermined path and adjacent said selected surface of the ion target and to the said electron collector.

3. The integrated sputtering means of claim 2 further comprising second and third magnetic means positioned in a spaced relationship to said magnetic means and having pole tips located on the underside of said ion target and having a magnetic orientation cooperating with the lines of flux of said magnetic means to direct lines of flux between said pole tips and said magnetic means to form a substantially uniform B field across said selected surface of the ion target.

4. The integrated sputtering apparatus of claim 2 further comprising a supplemental magnetic means located on the underside of said ion target and positioned with the pole piece thereof oriented relating to the magnetic means to urge the magnetic flux between the pole pieces thereof relative to the flux of the magnetic means to form a substantially uniform B field across the selected surface of said ion target.

5. The integrated sputtering means of claim 1 wherein said magnetic means includes a coil means operatively coupled to spaced ferromagnetic elements located along said predetermined path with said ion target therebetween wherein said coil means is responsive to a controlled current applied thereto to establish between ferromagnetic elements magnetic lines of force and for varying the same across the selected surface of said ion target and coil means being responsive to a control signal to vary said magnetic lines of force emanating from said magnetic means across said selected surface of an ion target to control the magnitude of the B field across the selected surface of said ion target.

6. The integrated sputtering means of claim 5 further comprising control means operatively coupled to said coil means for applying a control signal thereto for varying the strength of the magnetic lines of force and resulting B field by controlling the electric current through the coil means to control the magnitude of the B field on the selected surface of said ion target.

7. A multi-stage, integrated sputtering apparatus comprising means defining a support having a plurality of sputtering stages therein and which includes means for defining a plurality of independent spaced parallel predetermined paths one of which extends through use of each of the sputtering stages;

a plurality of means for mounting ion targets on in each of said sputtering stages and along the predetermined paths associated with said sputtering stages, each of said ion targets being formed of at least one selected material and positioned such that a selected surface of said ion target is contiguous its associated predetermined path which extends across its associated said sputtering stage such that each selected surface of each ion target forms a lower boundary for its associated predetermined path, at least one of said mounting means and its associated ion target of each of the plurality of mounting means and ion targets including means for containing electrons adjacent its associated ion target selected surface;

means for emitting and collecting electrons positioned in each of said sputtering stages wherein an electron emitting means is located at one end of each predetermined path and an electron collecting means is located at the other end of each predetermined path; and magnetic means positioned along each of said predetermined paths and located in a predetermined spaced relationship from each of the selected surfaces of each of the ion targets located along each of said predetermined paths wherein the direction of the B field established by said magnetic means is oriented in a predetermined direction relative to each of said predetermined paths to produce a plurality of separate controlled magnetic fields of flux having substantially linear shaped lines of ofrce occurring across each of said predetermined paths which define a magnetic flux pattern having at least one selected flux density adjacent each selected surface of each ion target, said selected surface of said ion target, each of said electron containing means and said substantially linear lines of flux define a plasma containment envelope which entraps and contains a plasma adjacent said selected surface to obtain a controlled uniform target erosion from each of said ion targets.

8. A multi-stage, integrated sputtering apparatus of claim 7 further comprising means for establishing a voltage between said ion target and ground for producing an electromotive force which defines an E field wherein the direction of the E field of the voltage establishing means is perpendicular to the predetermined direction of said B field and in a direction to cause the average velocity vector of the electrons emitted by said electron emitter to be directed along said predetermined path and adjacent said selected surface of the ion target and to the said electron collector.

9. The multi-stage integrated sputtering apparatus of claim 8 further comprising means for transporting an elongated strip of material which is adapted to have at least one layer of a thin film of material sputtered thereon along a pathway which is contiguous to and substantially normal to each of the predetermined paths and to the selected surface of the ion target associated with its predetermined path to form said at least one sputtered thin film layer of material on said elongated strip of material as it is transported along said pathway and through each stage of said multi-stage integrated sputtering apparatus.

10. The integrated sputtering means of claim 2 wherein said ion target is formed of a magnetic material which conducts magnetic lines of flux from said magnetic means.

11. The integrated sputtering means of claim 2 wherein said ion target is formed of a non-magnetic material having magnetic lines of flux passing over its selected surface and underside surface.

12. The integrated sputtering means of claim 3 wherein said ion target is formed of a magnetic material which conducts magnetic lines of flux from said magnetic means.

13. The integrated sputtering means of claim 3 wherein said ion target is formed of a non-magnetic material having magnetic lines of flux passing over its selected surface and underside surface.

14. The integrated sputtering means of claim 4 wherein said ion target is formed of a magnetic material which conducts magnetic lines of flux from said magnetic means.

15. The integrated sputtering means of claim 4 wherein said ion target is formed of a non-magnetic material having magnetic lines of flux passing over its selected surface and underside surface.

16. A method for forming a thin film layer of material on an article within a sputtering zone comprising the steps of mounting an ion target formed of at least one selected material within the sputtering zone and positioned a predetermined distance from a said article with the selected surface of an ion target forming a lower boundary for a predetermined path which extends across the selected surface of the ion target;

forming along said predetermined path and between a said article and selected surface of the ion target a stream of electrons which flow from an electron emitter to an electron collector and containing electrons adjacent the ion target selected surface with an electron containing means;

positioning along the predetermined path in a predetermined spaced relationship from the selected surface of the ion target a magnetic means for producing substantially linear shaped lines of magnetic flux which define a B field wherein the direction of the B field of the magnetic means is oriented in a predetermined direction relative to the predetermined path and adjacent the selected surface; and applying a voltage between said ion target and a ground for producing an electromotive force which defines an E field wherein the direction of the E field of the voltage is perpendicular to the predetermined direction of the B field and in a direction to urge the stream of electrons which flow from an electron emitter to an electron collector to be directed along said predetermined path and adjacent said selected surface of the ion target wherein said selected surface of said ion target, said electron containing means and said substantially linear lines of flux define a plasma containment envelope which entraps and contains a plasma adjacent said selected surface to obtain controlled uniform target erosion.

17. The method of claim 16 further comprising the steps of controlling the magnetic means to establish the magnitude of the magnetic flux density which defines the B field at a preselected flux density.

18. The method of claim 17 wherein said article is an elongated strip and further comprising the step of transporting said elongated strip past the selected surface of said ion target wherein one surface of the elongated strip material is positioned adjacent the selected surface of said ion target.

19. A method for forming a plurality of thin film layers of material within a plurality of sputtering zones comprising the steps of mounting a plurality of ion targets each of which are formed of at least one selected material in a planar spaced relationship relative to each other such that each of said ion targets are positioned in one of the sputtering zones and are positioned a predetermined distance from the selected surface of a said article, with each of the selected surfaces of each of the ion targets forming a lower boundary which extends across the selected surface of its associated ion target;

forming across the predetermined path and between a said article and selected surface of each of the ion targets a stream of electrons which flow from an electron emitter located at each end of said predetermined path to an electron collector located at the other end of each associated predetermined path and containing the electrons adjacent each of the ion target selected surfaces with electron containing means;

positioning along each of the plurality of predetermined paths in a predetermined spaced relationship from each of the selected surfaces of each of the ion targets a magnetic means for producing substantially linear shaped lines of magnetic flux which define a B field relative to each of the predetermined paths when the direction of the B field of the magnetic means is oriented in a predetermined direction relative to each of its associated predetermined path adjacent the selected surface of the ion target; and applying a voltage between said ion target and a ground for producing an electromotive force which defines an E field wherein the direction of the E field of the voltage is perpendicular to the predetermined direction of the B field and in a direction to urge the stream of electrons which flow from an electron emitter to an electron collector, each of said selected surface of said ion target, each of said electron containing means and said substantially linear lines of flux define a plasma containment envelope which entraps and contains a plasma adjacent said selected surface to obtain a controlled uniform target erosion from each of the said ion targets.

20. The method of claim 19 further comprising the step of controlling the magnetic means along each of the plurality of predetermined paths to establish the magnitude of the magnetic flux density which defines the B field at a preselected flux density for each of the predetermined paths.

21. The method of claim 19 wherein said article is an elongated strip and further comprising the step of transporting said elongated strip past each of the selected surfaces of each of said ion targets wherein one surface of the elongated strip material is positioned adjacent each of the selected surfaces of said ion targets.

22. Apparatus for depositing a thin film of material on a substrate by triode sputtering from an ion target material comprising
- an enclosure;
- means for evacuating said enclosure;
- an integrated sputtering means operatively coupled to said enclosure including
  - means for defining a housing having a first cavity and a second cavity spaced a predetermined distance from said first cavity and means for defining a predetermined path extending between said first cavity and said second cavity positioned along said predetermined path;
  - means for mounting in the interior of the housing an ion target defining means formed of at least one selected material, said ion target being positioned in said interior of the housing defining means with a selected surface of said ion target positioned contiguous said predetermined path and between the cavities thereby forming a lower boundary for said predetermined path, at least one of said mounting means and said ion target including means for containing electrons adjacent the ion target selected surface;
  - an electron emitter positioned in one of said first cavity and said second cavity;
  - an electron collector positioned in the other of said first cavity and said second cavity;
  - magnetic means positioned along said predetermined path and located in a predetermined spaced relationship from said selected surface for producing lines of magnetic flux which define a B field wherein the direction of the B field of the magnetic means is oriented in a predetermined direction relative to said first and second cavities and to said predetermined path adjacent said selected surface to produce a controlled magnetic field of flux having substantially linear shaped lines of force which define a magnetic flux pattern having at least one selected flux density adjacent said selected surface, said selected surface of said ion target, said electron containing means and said substantially linear lines of flux define a plasma containment envelope which entraps and contains a plasma adjacent said selected surface to obtain controlled uniform target erosion;
- means for providing an ionizable gas to said enclosure;
- means for mounting a substrate within said enclosure and positioned relative to said integrated sputtering means and adapted to have sputtered ion target material deposited thereon;
- means for applying a voltage potential between said electron emitter and said electron collector to produce a flow of electrons from said electron emitter to said electron collector of sufficient energy to ionize an ionizable gas along said predetermined path contiguous said first surface of the ion target establishing thin film plasma flow extending from the opening between said first cavity, said second cavity and said predetermined path; said thin film plasma flow being defined on the lower boundary by said first surface of said ion target and on the upper boundary by said shaped magnetic lines of force; and
- means for applying a negative voltage potential on said ion target to extract and accelerate positively charged ions into said first surface of ion target material forming said lower boundary from said thin film plasma flow to sputter atoms of material from said ion target first surface forming an atmosphere of and depositing atoms of ion target material on the substrate and to produce an electromotive force which defines an E field wherein the direction of the E field of the voltage establishing means is perpendicular to the predetermined direction of the B field and in a direction to cause the average velocity vector of the electrons emitted by said electron emitter to be directed along said predetermined path and adjacent said selected surface of the ion target and to the said electron collector.

23. The apparatus of claim 22 wherein said integrated sputtering means further comprises
- second and third magnetic means positioned in a spaced relationship to said magnetic means and having pole tips located on the underside of said ion target and having a magnetic orientation cooperating with the lines of flux of said magnetic means to direct lines of flux between said pole tips and said magnetic means to form a substantially uniform B field across said selected surface of the ion target.

24. The apparatus of claim 22 wherein said integrated sputtering apparatus further comprises
- a supplemental magnetic means located on the underside of said ion target and positioned with the pole piece thereof oriented relating to the magnetic means to urge the magnetic flux between the pole pieces thereof relative to the flux of the magnetic means to form a substantially uniform B field across the selected surface of said ion target.

25. Apparatus for depositing a thin film of material on a substrate by triode sputtering from an ion target material of claim 22 wherein said enclosure includes
- means defining an opening in an exterior surface of said enclosure; and
- means external and operatively coupled to said enclosure opening defining means and to said housing defining means for mounting the housing defining means with the opening positioning the selected surface of the ion target within the enclosure, said housing defining means further being positioned with said predetermined path, the first cavity and the second cavity and the opening interior to the enclosure; and wherein
- said magnetic means is positioned in said predetermined spaced relationship from said ion target for establishing in said enclosure said controlled magnetic field of flux having shaped lines of force which define a magnetic flux pattern having at least one selected flux density adjacent said selected surface of the ion target.

26. A method for controlling the rate at which an ion target material can be sputtered from a selected surface of an ion target in triode sputtering apparatus wherein a plasma is formed in the vicinity of the selected surface of the ion target by electrons being transported along a predetermined path contiguous the selected surface from a cathode to an anode, which electrons collide with and ionize an ionizable gas thereby producing charged ions which sputter atoms of material from the ion target, comprising the step of
- establishing with a magnetic means positioned along the predetermined path in a predetermined spaced relationship from the selected surface of the ion target substantially linear shaped lines of magnetic flux which define a B field wherein the direction of the B field of the magnetic means is oriented in a predetermined direction relative to the predetermined path and adjacent the selected surface;

containing the electrons adjacent to the selected surface of said ion target with an electron containing means; and establishing with a voltage means between said ion target and a ground an electromotive force which defines an E field wherein the direction of the E field of the voltage is perpendicular to the predetermined direction of the B field and in a direction to urge the stream of electrons which flow from an electron emitter to an electron collector along said predetermined path and adjacent said selected surface of the ion target.

27. An integrated sputtering means for use in combination with an evacuable enclosure, comprising means defining a housing having a pair of spaced cavities having a predetermined distance therebetween and means for defining a predetermined path extending between said cavities positioned along said predetermined path;

means for mounting in the interior of the housing defining means an ion target formed of at least one selected material, said ion target being positioned in said interior of the housing defining means with said selected surface of said ion target positioned contiguous said predetermined path and between the cavities thereby forming a lower boundary for said predetermined path, said selected surface of said ion target, said electron containing means and said substantially linear lines of flux define a plasma containment envelope which entraps and contains a plasma adjacent said selected surface to obtain controlled uniform target erosion;

means positioned in said cavities for producing a copious supply of electrons therebetween; and magnetic means positioned along said predetermined path and located in a predetermined spaced relationship from said selected surface for producing substantially linear shaped lines of magnetic flux which define a B field wherein the direction of the B field of the magnetic means is oriented in a predetermined direction relative to said first and second cavities and to said predetermined path adjacent said selected surface to produce a controlled magnetic field of flux having shaped lines of force which define a magnetic flux pattern having at least one selected flux density adjacent said selected surface, said selected surface of said ion target, said electron containing means and said substantially linear lines of flux define a plasma containment envelope which entraps and contains a plasma adjacent said selected surface to obtain controlled uniform target erosion.

28. The integrated sputtering means of claim 27 further comprising means for establishing a voltage between said ion target and ground for producing an electromotive force which defines an E field wherein the direction of the E field of the voltage establishing means is perpendicular to the predetermined direction of the B field and in a direction to cause the average velocity vector of the electrons emitted by said electron emitter to be directed along said predetermined path and adjacent said selected surface of the ion target and to the said electron collector.

29. The integrated sputtering means of claim 27 further comprising second and third magnetic means positioned in a spaced relationship to said magnetic means and having pole tips located on the underside of said ion target and having a magnetic orientation cooperating with the lines of flux of said magnetic means to direct lines of flux between said pole tips and said magnetic means to form a substantially uniform B field across said selected surface of the ion target.

30. The integrated sputtering apparatus of claim 27 further comprising a supplemental magnetic means located on the underside of said ion target and positioned with the pole piece thereof oriented relating to the magnetic means to urge the magnetic flux between the pole pieces thereof relative to the flux of the magnetic means to form a substantially uniform B field across the selected surface of said ion target.

* * * * *